United States Patent [19]

Vinton

[11] 4,125,418

[45] Nov. 14, 1978

[54] UTILIZATION OF A SUBSTRATE ALIGNMENT MARKER IN EPITAXIAL DEPOSITION PROCESSES

[75] Inventor: David J. Vinton, Burgess Hill, England

[73] Assignee: U.S. Philips Corporation, New York, N.Y.

[21] Appl. No.: 725,775

[22] Filed: Sep. 23, 1976

[30] Foreign Application Priority Data

Oct. 6, 1975 [GB] United Kingdom ............... 40776/75

[51] Int. Cl.² ..................... H01L 21/20; H01L 21/66
[52] U.S. Cl. ...................... 148/175; 29/574; 148/1.5; 148/174; 156/626; 156/662; 156/657; 250/397; 250/492 A
[58] Field of Search .................. 148/1.5, 174, 175; 29/574; 156/626, 662, 657; 250/397, 492 A

[56] References Cited

U.S. PATENT DOCUMENTS

| | | | |
|---|---|---|---|
| 3,428,499 | 2/1969 | Cullis | 148/174 |
| 3,539,876 | 11/1970 | Feinberg et al. | 148/175 UX |
| 3,671,338 | 6/1972 | Fujii | 148/175 |
| 3,679,497 | 7/1972 | Handy et al. | 156/626 |
| 3,710,101 | 1/1973 | O'Keeffe et al. | 250/492 A X |
| 3,715,242 | 2/1973 | Daniel | 148/1.5 |
| 3,832,561 | 8/1974 | O'Keeffe | 250/397 X |
| 3,879,613 | 4/1975 | Scott et al. | 250/492 A |
| 3,895,234 | 7/1975 | O'Keeffe et al. | 250/492 A |

OTHER PUBLICATIONS

Scott, J. P., "Electron Image Projector with Automatic Alignment", IEEE Trans. on Electron Devices, vol. ED-22, No. 7, Jul. 1975, pp. 409–413.

Primary Examiner—L. Dewayne Rutledge
Assistant Examiner—W. G. Saba
Attorney, Agent, or Firm—Frank R. Trifari

[57] ABSTRACT

An alignment marker on a substrate surface is covered with polycrystalline semiconductor material during the growth of an epitaxial layer on the monocrystalline substrate. This polycrystalline material is then removed with a selective etchant to re-expose the marker for use in defining an area for processing at the epitaxial layer surface. Permits accurate alignment between buried layers and regions formed from the epitaxial layer surface. Permits provision of the marker on the substrate when it is undesirable to provide the marker on the epitaxial layer surface. Particularly advantageous for electron image projection exposure of electron-sensitive resists.

7 Claims, 10 Drawing Figures

UTILIZATION OF A SUBSTRATE ALIGNMENT MARKER IN EPITAXIAL DEPOSITION PROCESSES

This invention relates to methods of manufacturing a semiconductor device in which a processing step is effected at an area of a surface (particularly but not exclusively with the aid of a patterned electron beam), the location of said area being defined relative to a reference marker. The invention further relates to semiconductor devices manufactured by such methods.

It is known to use an electron beam to define an area at a semiconductor wafer surface where a processing step is to be effected. A pattern can be defined in a layer of electron-sensitive material on the wafer surface, by selectively exposing the layer with the electron beam. As is known, such a layer may be an electron resist, for example a positive resist such as polymethylmethacrylate (PMMA) which can be readily dissolved in certain solvents where exposed to the electron beam, to leave a resist pattern; such a resist pattern provided on an insulating layer on the wafer surface can then be used as an etchant-mask for defining windows in the insulating layer, for example for contacting or doping purposes. Other forms of electron-sensitive layers are known, for example organic silicon compounds such as polymethylcyclosiloxane (PMCS) which becomes insoluble in certain organic solvents where exposed to the electron beam; a silicon oxide layer pattern can then be formed by suitable heat-treatment of these insoluble parts. Other uses of electron beam technology are known for semiconductor device fabrication, such as electron beam bombardment of selective areas of the semiconductor wafer surface itself or of an insulating layer on the semiconductor wafer.

The selective exposure to the electron beam may be effected either by deflecting a narrow beam to trace out the required pattern or by projecting an electron image in a wide beam, for example, from a photo-cathode illuminated through windows of a mask which correspond to the desired electron image. An example of the latter method and its advantages is disclosed in U.S. Pat. No. 3,679,497, and the article by T. W. O'Keefe, J. Vine and R. M. Handy in "Solid State Electronics", Vol. 12 (1969), pages 841 to 848. Reference is also invited to the articles by J. P. Scott in "Journal of Applied Physics", Vol. 46, No. 2, February 1975, pages 661 to 664, and "Proceedings of Sixth International Conference on Electron and Ion Beam Science and Technology" (Electrochemical Society, Princeton N.J.), pages 123 to 136, and to our co-pending United Kingdom patent application No. 20778/74 (PHB 32432).

When using such techniques for the manufacture of semiconductor devices it is usually necessary to make successive selective exposures to electron beams because different parts of the wafer require successive processing usually over different areas to obtain different regions of the device. It is usually necessary for each of these multiple exposures to be correctly aligned on the wafer relative to the others. This alignment can be effected by defining the location of exposure areas relative to a reference marker on part of said wafer surface. The marker can be identified by the electron beam, and a signal derived from the marker can indicate any positional error between the semiconductor wafer and the setting of the electron beam. A variety of such markers are known, for example patterns of metal-based layers both on the semiconductor wafer surface itself and on insulating layers on the wafer surface. In this connection reference is invited to, for example, U.S. Pat. Nos. 3,710,101, 3,715,242 (PHB 32022), and 3,832,561. As described in these Patents and our co-pending United Kingdom patent application No. 20447/74 (PHB 32431) and in the article by J. P. Scott in "I.E.E.E. Transactions on Electron Devices", Vol. ED-22, No. 7, July 1975, pages 409 to 413, an electrical signal which can be derived for alignment purposes can correspond, for example, to a current through the marker to the wafer, or to secondary electron emission or X-ray emission from the marker.

Such electron-beam techniques using alignment markers have been successfully employed for processing steps, all of which are at or adjacent the same major surface of the wafer, for example as in MOS integrated circuits. However problems arise with the manufacture of other types of semiconductor device (such as for example bipolar transistor circuits and integrated-injection logic ($I^2L$) circuits) when processing is necessary both at the surface of a semi-conductor substrate and at the surface of an epitaxial layer on said substrate. Thus, if an alignment marker is provided on the substrate surface for processing at that surface, it becomes covered with semiconductor material during the deposition of the epitaxial layer and in this state is no longer accessible to the electron beam.

Often the only processing required at the substrate surface is localised doping for a buried layer, and (as is well-known in the semiconductor art) the location of such a buried layer is usually detectable when covered with an epitaxial layer because a depression in the epitaxial layer surface is usually formed over the buried layer; this depression is often used for alignment purposes at the epitaxial layer surface. In this connection reference is invited to, for example, co-pending United Kingdom patent application No. 22054/74 (PHN 6926). It has therefore been proposed to effect the processing at the substrate surface without an alignment marker, and then provide an alignment marker on the epitaxial surface for processing at that surface, the location of the marker being defined relative to the depression in the epitaxial layer surface over the buried layer. However as described in said United Kingdom patent application No. 22054/74, this depression is not always accurately aligned with the buried layer. It is difficult to accurately locate the marker relative to this depression, and this proposed solution does not provide an alignment marker which would permit accurate alignment for successive processing steps at the substrate surface.

This problem of alignment for processing at both a substrate surface and an epitaxial layer surface is not restricted to electron-beam technology. Thus, the use of alignment markers on a semiconductor wafer is also relevant to ion implantation using a narrow deflecting ion beam to trace out the required pattern on the wafer, and, for example, U.S. Pat. No. 3,569,718 discloses the use of a reflective marker on a semiconductor wafer surface for automatic alignment of a semiconductor wafer and a photomask for conventional photolithography.

The problem of an alignment marker on a substrate surface becoming covered with a deposited layer and so rendered ineffective for use with subsequent processing steps at the surface of the layer is also relevant to cases where the marker is not used for aligning localised processing at the substrate surface. Thus, for example it would be desirable to provide such an alignment marker on the substrate surface in those cases where the processing used to form the marker might adversely affect the desired characteristics of the epitaxial layer if the marker were instead provided on the epitaxial layer. Such an alignment marker may be required solely for processing at the epitaxial layer surface, and the substrate may even in some cases be non-semiconductor, for example a single crystal sapphire substrate.

According to the present invention, a method of manufacturing a semiconductor device in which a processing step is effected at an area of the surface of a semiconductor layer portion provided on a substrate surface, the location of said area being defined relative to a reference marker, said method including (a) providing said reference marker on part of said substrate surface, (b) depositing semiconductor material on said substrate surface and on said marker to form a layer one portion of which grows epitaxially on a part of said substrate surface not covered by said marker to form a monocrystalline portion of the layer while another portion of the layer grows on the surface of said marker as polycrystalline material, and (c) removing the polycrystalline portion over the said marker using an etchant which attacks the polycrystalline material of the layer faster than the monocrystalline material, and so re-exposing the said marker for use with said processing step at the surface of the remaining semiconductor layer portion.

Such a method has the advantage that the alignment marker previously provided on the substrate surface is used for processing at the surface of the subsequently-provided semiconductor layer portion. The same alignment marker can even be used both for a previous processing step at the substrate surface and for said processing step at the epitaxial layer surface; this permits accurate alignment of, for example, buried layers at the substrate-epitaxial layer interface with, for example, regions formed in the epitaxial layer. Such accurate alignments are particularly advantageous with processing steps effected with the aid of a patterned electron beam which readily permits accurate definition of well-defined areas for processing.

The method has the further advantage that the re-exposure of the marker on the substrate surface is effected in a self-registered manner by growing polycrystalline material on the marker and by using an etchant which attacks this polycrystalline material faster than the monocrystalline material; thus, it is not necessary to define the portion of the semiconductor layer to be removed by accurately aligning a masking layer on the epitaxial layer surface relative to some feature indicative of the location of the buried marker.

The transverse dimensions of the area of the substrate surface occupied by the marker may be, for example, at least one or two orders of magnitude greater than the thickness of the deposited layer of semiconductor material, so that when the polycrystalline portion of the layer over the marker is removed the resulting aperture in the layer is comparatively wide. If, for example, an electron-resist film is subsequently spun over the epitaxial layer surface, such a wide aperture is desirable for preventing pile-up of the resist film over the marker; such accummulation of the resist over the marker could occur with a very narrow aperture and could inhibit functioning of the alignment marker.

During the removal of said polycrystalline portion using said etchant, a protective layer may be provided over at least the major part of the surface of said monocrystalline portion to protect said surface part (which is generally used for active device areas) against, for example any attack or contamination by the etchant. No accurate alignment is necessary for providing this protective layer, because it is the faster etching rate of the polycrystalline material (rather than this protective layer) which is used to define the portion of the layer removed for exposing the marker.

It should be noted that some types of reference marker are known on which monocrystalline semiconductor material would grow. Thus, for example, reference markers for identification by an electron beam are disclosed in United Kingdom patent specification Nos. 1,291,575 and 1,336,626 (PHB 32217) in the form of identations in the monocrystalline wafer surface and of diffused surface regions of the monocrystalline wafer, respectively. It will be evident that for methods in accordance with the present invention the reference marker must have a surface of such nature that, with the conditions chosen for epitaxial growth of the semiconductor layer, polycrystalline material grows on the surface of the marker. This can often be achieved by coating the marker area with a thin insulating layer if the surface of the marker pattern itself is unsuitable for polycrystalline growth. Coating the marker pattern with a thin insulating layer can be advantageous even when polycrystalline growth would be possible on the marker pattern itself, because such a coating can be used to protect the marker against the processing used for forming the semiconductor devices. Markers comprising a metal-based layer pattern (for example of oxidized zirconium or tantalum or the metal itself) are particularly advantageous for identification by an electron beam, for example using secondary electron emission or X-ray emission from the marker. Such a marker may advantageously comprise an oxidized-metal layer pattern enveloped between first and second protective layers, the first protective layer on the layer pattern serving to protect said layer pattern during the processing steps, the second protective layer being present between the oxidised-metal layer pattern and said substrate. This second protective layer may serve to protect the substrate against contamination from said layer pattern, and to increase the adhesion of said layer pattern to the wafer.

Embodiments of the present invention will now be described, by way of example, with reference to the accompanying diagrammatic drawings, in which.

Figure 1:
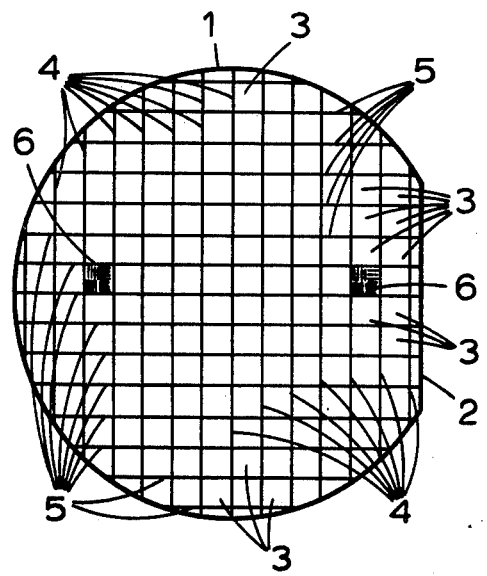
FIG. 1 is a plan view of a semiconductor wafer processed to provide an array of semiconductor devices.
Figure 3:
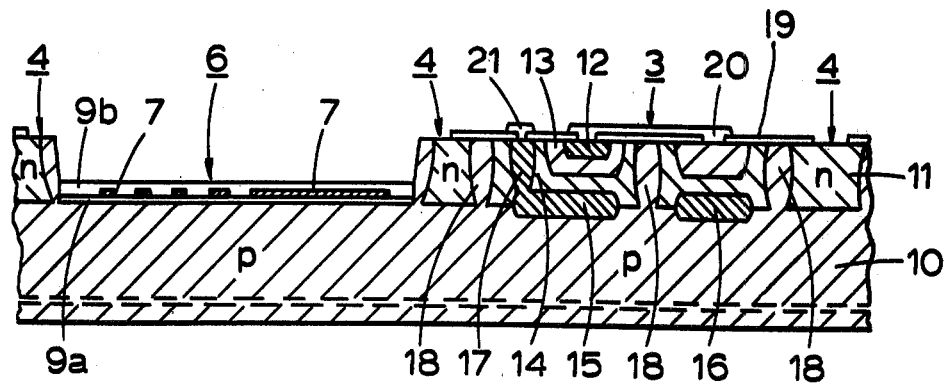
FIG. 3 is a cross-sectional view of a marker area and an adjacent device area of the wafer of FIG. 1.
Figure 7:
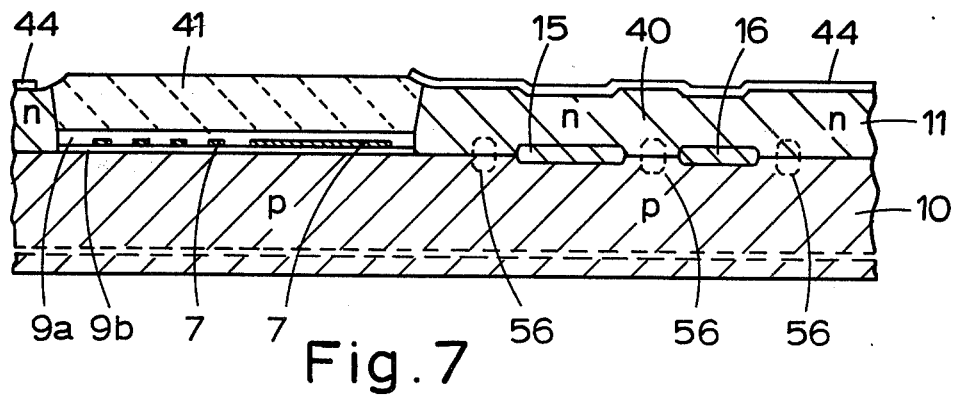
Figure 8:
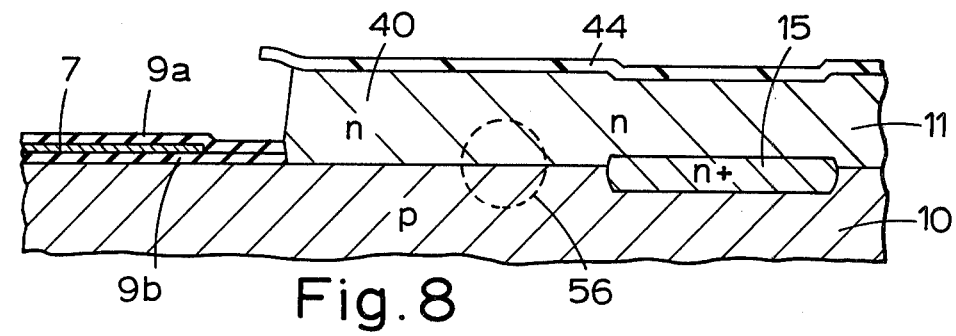
Figure 9:
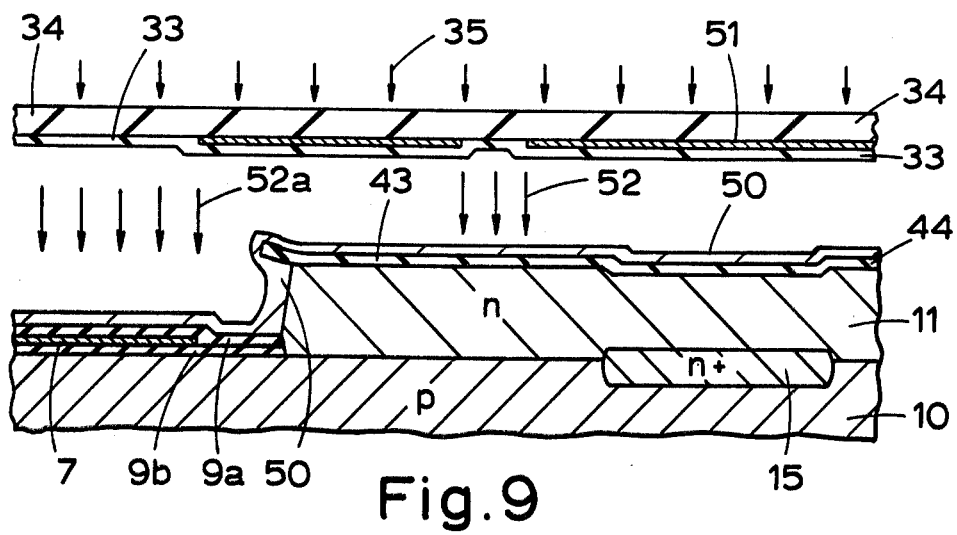
Figure 10:
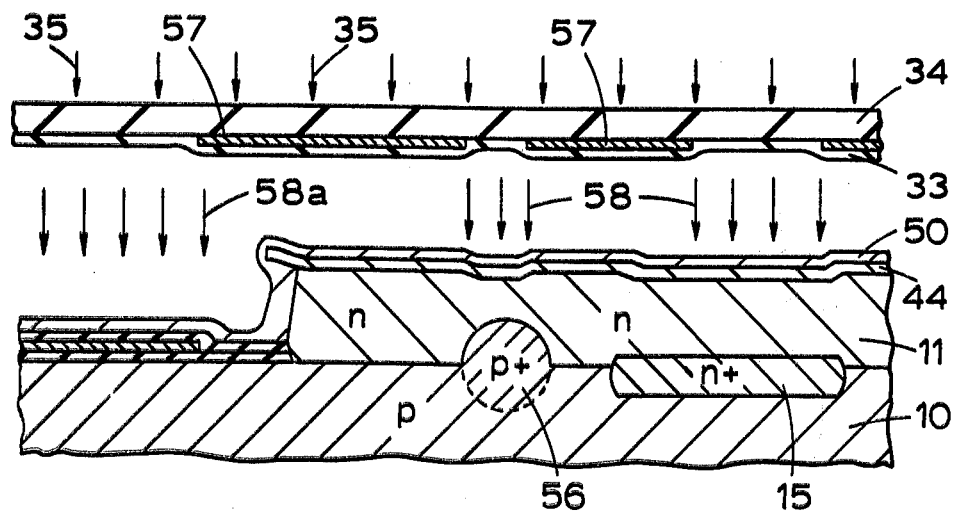

FIGS. 4 to 9 are cross-sectional views illustrating various steps in the manufacture of the device arrays of FIG. 1 using a method in accordance with the present invention, FIGS. 3 to 6, and 8 and 9 being enlarged views of only part of the marker area and device area of FIG. 3, and FIG. 10 is a cross-sectional view illustrating a modification of the processing step of FIG. 9 in a modified method of manufacture also in accordance with the present invention.

Figure 2:
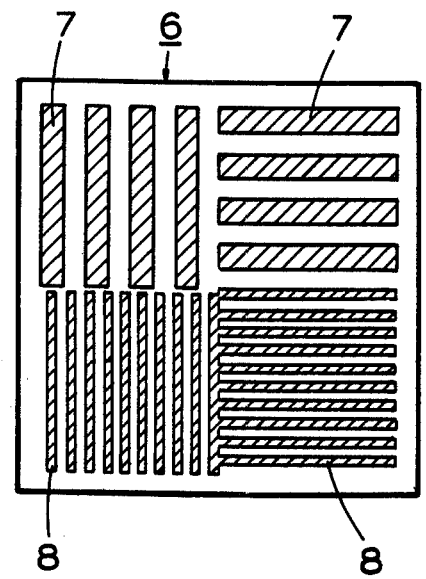
FIG. 2 is a plan view of a reference marker area of the wafer of FIG. 1.

The semiconductor wafer arrangement illustrated in FIGS. 1 to 3, comprises a monocrystalline semiconductor wafer 1 of, for example, silicon, having a substantially uniform thickness (which may be for example approximately 250 microns) and (as shown in FIG. 1) a circular outline with a conventional alignment flat 2.

The wafer 1 consists mostly of an array of semiconductor device areas 3 which are separated from each other by two orthogonal sets 4 and 5 of scribing lanes. The wafer 1 can be divided along these lanes in conventional manner (for example by sawing, or by diamond- or laser-scribing and cracking) into individual bodies for each semiconductor device. In the form illustrated by way of example in FIG. 3 each semiconductor device is an integrated circuit comprising at least on n-p-n bipolar transistor (12, 13, 14).

However, two of the wafer areas bounded by the scribing lanes 4 and 5 are reference marker areas 6. The areas 6 may as shown in FIG. 2 contain a metal-based layer pattern of coarse and fine lines 7 and 8 respectively, each type of line being arranged in two orthogonal groups. Typical widths for the coarse and fine lines 7 and 8 are, for example 100 microns and 10 microns respectively. As shown in FIG. 3, the layer pattern 7, 8 is enveloped between two protective layers 9a and 9b. A typical dimension for each side of the marker areas 6 (and for integrated circuit device areas 3) is for example 1.9 to 2.0 mm. However, it will be appreciated that these dimensions will vary according to the area of wafer required for a particular device structure.

As shown in FIG. 3, the wafer may comprise a monocrystalline semiconductor substrate 10 having thereon an epitaxial layer 11. The whole of the marker arrangement 7 to 9 is present on part of the surface of the substrate 10 at a wide aperture in the epitaxial layer 11. Typically the layer 11 is 2 or 3 microns thick, which is between 2 and 3 orders of magnitude less than the width of the marker areas 6. As shown in FIG. 3, most of the semiconductor device regions, for example, emitter, base and collector regions 12, 13 and 14, respectively, are formed in the epitaxial layer 11. Buried layers, for example layers 15 and 16, are present at the interface between the substrate 10 and the epitaxial layer 11. Thus, for example the layer 15 may serve for reducing the collector series resistance of bipolar transistor 12, 13, 14 and may be contacted via a surface-adjoining collector contact zone 17 which extends locally through the layer 11. The device areas 3 of the epitaxial layer 11 are divided into islands for circuit-element isolation in known manner by isolation walls 18 which extend locally through the layer 11 and are of opposite conductivity type. Via windows in an insulating and passivating layer 19 present on the device areas 3, metal conductor tracks (such as tracks 20 and 21 shown in FIG. 3) are connected to the various circuit elements of each integrated circuit device area 3. For the sake of clarity semiconductor portions in the cross-sectional views of FIGS. 3 to 10 are hatched in one direction if p-type and in the opposite direction if n-type. It should also be noted that the dimensions of various portions of the Figures have been exaggerated or reduced in order to more clearly show in a compact manner the structure and arrangement of the various portions.

The fabrication of the various portions of each integrated circuit requires successive processing at selective areas of the substrate surface and the epitaxial layer surface. This may be effected in the following manner, using the same alignment markers 7, 8.

The starting material is a monocrystalline silicon substrate of one conductivity type (for example 20 to 40 ohm.cm. p-type material). Protective layers 9a are provided on the substrate surface by, for example, thermal oxidation to grow a silicon oxide layer of a thickness sufficient to inhibit impurity diffusion into the substrate from the marker during the subsequent device processing. Typically such an oxide layer may be approximately 0.6 micron thick and be formed over the whole substrate surface. The two marker areas 6 having patterns 7, 8 are then formed on the oxide layer in known manner. For this purpose, the oxide layer may be coated with an electron-resist, which is then selectively exposed and developed to form apertures where the patterns 7 and 8 are to be provided. These apertures are in a predetermined location and orientation relative to the flat edge 2 of the substrate 10. A heavy metal such as tantalum may then be deposited (for example by sputtering) to a thickness of for example 1,000 Å (0.1 micron) over the apertured photoresist, after which the photoresist is dissolved away to leave the tantalum only as patterns 7, 8 on the protective oxide layer. The tantalum may then be oxidized (for example by heating to 1,200° C. in dry oxygen for approximately 15 minutes) to form a tantalum oxide pattern 7, 8. Protective layers 9b are formed from another insulating layer (for example a 0.15 micron thick layer of silicon nitride) which may then be deposited in known manner over the tantalum oxide patterns 7, 8 and the silicon oxide layer. Using known photolithographic and etching techniques the lateral extent of the nitride and oxide layers may then be restricted to two areas 6 on the substrate surface so that the protective layers 9a to 9b envelop the two tantalum oxide marker patterns 7, 8.

Figure 4:
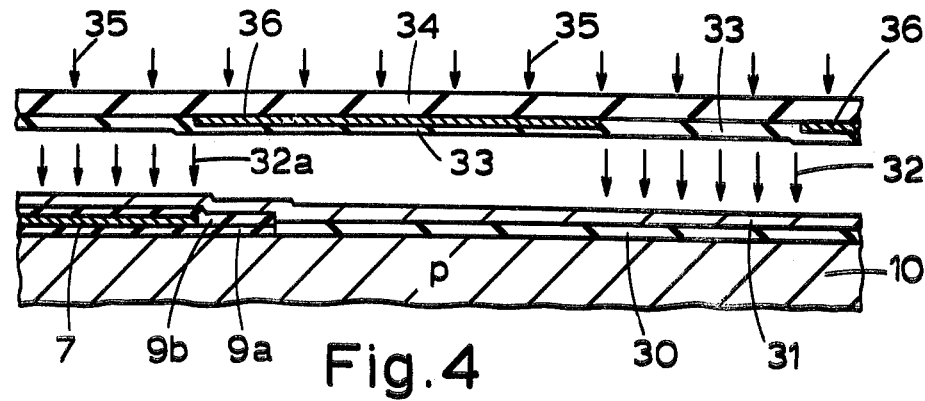
Figure 5:
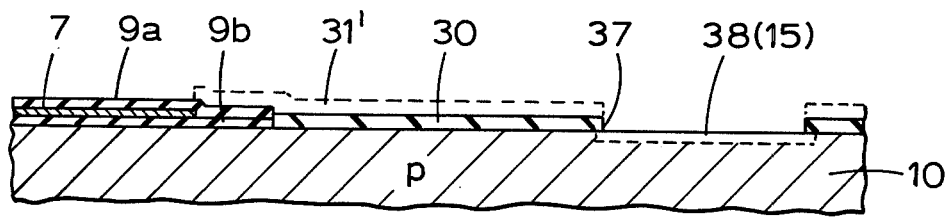

FIGS. 4 and 5 illustrate the use of these markers for a processing step at the surface of substrate 10. The exposed area of the substrate surface is first provided with a diffusion-masking layer 30 (for example a silicon oxide layer formed by oxidation in wet oxygen at 1,200° C. for 1 hour). The masking layer 30 is coated in known manner with an electron sensitive resist 31 which may be for example the positive electron resist material polymethylmethacrylate (PMMA) having a thickness of approximately 0.35 micron.

The substrate 10 may then be mounted in known manner in the vacuum chamber of a known electron image projector, see for example the projector described in said previously-mentioned articles by J. P. Scott and our co-pending United Kingdom patent application No. 20778/74. Using such equipment the resist coating 31 on the substrate 10 is selectively exposed in known manner, using a patterned electron beam 32 from a known type of photocathode 33 which is supported on a quartz plate 34 and is exposed to ultra-violet light 35 through a mask 36. The window pattern in the mask 36 is made to correspond to the desired pattern for electron beam 32. It will be evident that for the sake of clarity various dimensions in FIG. 4 have been exaggerated or reduced; thus, for example, in practice the quartz plate 34 is generally much thicker than the semiconductor substrate 10. Also, in order to indicate a patterned electron beam selectively exposing the resist 31, the beam 32 has been represented by straight arrows, although in practice the electrons of the beam travel along helical paths through the usual electromagnetic and electrostatic fields generated in the vacuum chamber.

There are two parts 32a of the beam 32 which have a pattern corresponding to the marker pattern 7, 8 of the marker areas 6 and are used in accurately aligning the beam 32 relative to the area of the substrate surface to be processed. This accurate alignment can be effected automatically in known manner, for example by using phase-sensitive detection of X-ray emission from pattern 7, 8 when bombarded by the electrons. Such a detection and alignment method is described in for example the previously mentioned I.E.E.E. Transactions on Electron Devices paper by J. P. Scott, the Electron and Ion Beam Science and Technology Conference paper by J. P. Scott and in our co-pending United Kingdom patent application No. 20447/74 (PHB 32431). By using semiconductor detectors for the X-ray emission it is possible to automatically align the patterns in the beam area 32a and marker 7, 8 with such a small electron current density and in such a short time (for example tenths of a second) that it is not necessary to mask the other areas of the photocathode 33 to prevent exposure of resist layer 31 by the remainder of the beam 32.

After aligning the substrate markers 7, 8 relative to the electron beam patterns 32a, the resist coating 31 is exposed to the patterned electron beam 32 for a time sufficient to render the exposed areas of the electron sensitive resist 31 soluble in certain solvents used for "developing" the resist.

The substrate 10 is then removed from the vacuum chamber of the image projector, and the resist 31 is developed and then baked, both in known manner, to leave a resist pattern 31' on the masking layer 30. This pattern 31' is shown in broken outline in FIG. 5 and is used in known manner as an etchant mask to define windows such as window 37 in the layer 30 for defining the lateral extent of buried layers 15, 16 etc. of FIG. 3. After etching to form the windows 37, the resist pattern 31' is removed, and dopant of opposite conductivity type to that of substrate 10 may be diffused in known manner into the area of the substrate surface at windows 37, while using layer 30 as a diffusion mask. In order to obtain n-type zones for n-type buried layers, arsenic or antimony may be used as the dopant. The diffusion may be effected using known deposition and drive-in stages for the dopant. Reference 38 of FIG. 5 indicates one such diffused zone. It will be evident that the location of zones 38 has been defined relative to the marker pattern 7, 8.

After the diffusion the layer 30 is removed from the substrate surface and the surface is cleaned in known manner in readiness for epitaxial deposition. It is well known that of the drive-in diffusion is effected in oxygen, the resulting semiconductor surface has a depression at the area of the diffusion window.

Figure 6:
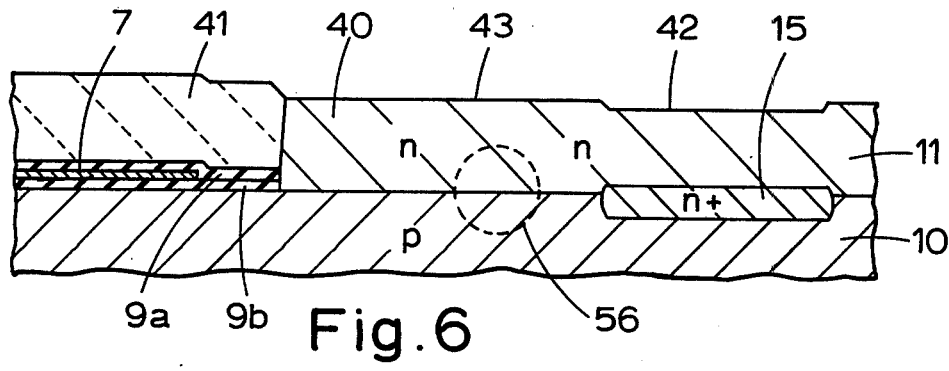

FIG. 6 illustrates the structure resulting from epitaxial deposition of silicon on the substrate surface. Such epitaxial growth may be effected by for example depositing silicon from silane gas in known manner at a rate of for example 0.3 micron per minute with a reactor temperature of, for example, 1,040° C. Before the deposition the substrate surface may be etch-cleaned in known manner by, for example passing HCl vapour over the substrate for approximately 3 minutes. The silicon material may be deposited to form an n-type layer 11 having a thickness of for example 3 microns and for example a resistivity of 0.6 ohm. cm. The major portion of the layer 11 grows epitaxially as monocrystalline material 40 in the substrate surface where not covered by the marker areas 6. However, portions of the layer 11 grow as polycrystalline material 41 on the surface of the marker areas 6. The locally-diffused surface zones 38 become buried in the semiconductor wafer at the substrate/epitaxial layer interface to form the buried layers 15, 16 etc.

As indicated diagrammatically in FIG. 6, a depression 42 may be present in the epitaxial layer surface 43 if a depression was formed as described earlier in the substrate surface. Such a depression 42 can complicate subsequent processing of the layer surface 43 and is preferably reduced or avoided, for example by effecting the drive-in diffusion of the buried layers in a non-oxidizing atmosphere. It is such a depression 42 which it has been proposed previously to use for identifying the locations of the buried layers 15, 16 etc. in order to locate an alignment marker on the epitaxial-layer surface 42 for defining the relative location of the areas for processing at surface 42.

However, in accordance with the present invention the marker patterns 7, 8 provided at the substrate surface are also used for alignment in subsequent processing steps at the surface 42 of the epitaxial layer 11, so that depression 42 is not required. This can be achieved in the following manner.

The polycrystalline portions 41 of the epitaxial layer 11 over the marker areas 6 are moved using an etchant which attacks the polycrystalline silicon material 42 faster than the monocrystalline material 40. A suitable etchant is a fluid consisting of 180 cc. of ethylene diamine, 30 gram. of pyrocatechol and 80 c.c. water.

If desired, the bulk of the monocrystalline portion 40 of layer 11 may be protected from the etchant by a protective layer pattern 44. Such a layer pattern can be formed by for example oxidising the layer surface to form a silicon oxide layer having a thickness of for example 0.6 micron, and then etching windows in the oxide layer to expose the polycrystalline portions 41 over the marker areas 6. These windows may be defined photolithographically; only a crude alignment is necessary (for example using the flat 2 and circular edge of the wafer 1), because it is the faster etching rate of the polycrystalline portion 41 (rather than the protective layer pattern 44) which is used to define the portion of the layer removed to re-expose the marker area 6. This crude alignment is indicated in FIG. 7 where the left-hand edge of the window is shown slightly spaced from portion 41, whereas the right-hand edge overlaps portion 41. Even if the exposed surface of the layer portion 40 is contaminated by the etchant, the crude alignment is normally such that the contamination occurs in a portion destined to form scribing lanes (5, 6) which are typically 50 microns wide and do not affect the active portion of the device areas 3. In any event, by using such a protective layer, device areas 3 remote from the portions 41 can be adequately protected.

In this manner, the polycrystalline portions 41 are removed to re-expose the alignment marker areas 6 at the substrate surface. The resulting wafer structure is shown in FIG. 8. This wafer structure may then be coated with electron resist (for example PMMA) as described previously. Because a wide aperture is formed in layer 11 by removing the portion 41, there is no excessive accumulation of resist 50 over the marker area 6; thus the marker pattern 7, 8 covered by both the protective layer 9b and the resist 50 can still be reached by electrons from a photocathode, and can thus function for alignment in defining areas for processing at the surface 43.

The wafer with the resist coating 50 is then mounted in the vacuum chamber of the electron image projector together with another photocathode assembly 33, 34, 51 for generating a patterned electron beam 52 by exposure through mask pattern 51. Part 52a of the beam 52 has a pattern corresponding to that of alignment marker pattern 7, 8. The remainder of the beam pattern is for defining areas for processing at the epitaxial-layer surface 43. In the same manner as described previously, the beam patterns 52a and marker patterns 7, 8 are aligned and then the resist layer is selectively exposed in the required areas, for example where required to define in oxide layer 44 a window for dopant diffusion to form the isolation walls 18 shown in FIG. 3. The structure is then further processed in known manner.

Thus, in this method, the same marker areas 6 which were used to define the locations of buried layers 15, 16 etc. are also used to define areas for processing to form diffusion windows for forming isolation walls 18, deep contact regions such as 17 for connection to the buried layers 15 etc., opposite-type regions (such as base region 13 above the buried layers 15) and further regions (such as emitter region 12) in these opposite-type regions. The same marker areas 6 can also be used in defining the location of contact windows in insulating and passivating layer 19 on the surface 43 and of metal conductor tracks such as track 20 contacting and connecting various semiconductor regions through the contact windows. This use of the same markers is of considerable advantage in permitting accurate alignment relative to each other of the areas subjected to the various processing steps and can result in for example requiring a smaller device area 3 for obtaining each device structure and in, for example, faster switching speeds or high frequency performance of some type of devices.

It will be obvious that many modifications are possible. Thus, for example instead of diffusing dopant throughout the thickness of epitaxial layer 11 from surface 43 to form the isolation wall 18, the wall 18 may be formed by dopant diffusion both from surface 43 and from a buried layer pattern 56. Such a buried layer pattern 56 can be formed by a diffused surface zone provided at the surface of substrate 10 in a manner similar to zone 38 and using the markers 6 for alignment; the photocathode arrangement 33, 34, 51 of FIG. 9 may be used for this processing at the substrate surface. Such a buried layer pattern 56 is shown in broken outline in FIGS. 6 to 8. FIG. 10 shows a subsequent stage which is a modification of that of FIG. 9 in which the resist coating 50 is selectively exposed with a different photocathode structure 33, 34, 57 to define areas for windows for a p-type diffusion designed to form both the upper portion of the isolation walls 18 and opposite-type regions (such as base region 13). Because the same marker is used for each process, the diffusion to form the upper half of isolation walls 18 can be accurately aligned with the buried layer pattern 56. Such an alignment is difficult to achieve in an accurate manner using known techniques.

It will be evident that other patterns and types of marker 7, 8 may be used, for example other known patterns such as those described in the Patent Specification and literature previously mentioned. It will also be evident that other device structures can be formed in device areas 3 of a wafer 1, and that other forms of processing, for example ion implantation can be employed for doping various regions. If so desired, by using an organic silicon compound such as PMCS insulating layer patterns may be formed directly from the electron-sensitive layer, instead of etching an insulating layer through an overlying electron-resist pattern.

In another form of device, for example having a sapphire substrate 10, the marker areas 6 provided on substrate 10 may be used solely in connection with processing at and from the surface of a silicon epitaxial layer 11 formed by deposition on the substrate surface and on the markers 6; in this case no localised processing is generally effected at the substrate surface before deposition of the layer 11.

What is claimed is:

1. A method of manufacturing a semiconductor device in which a processing step is effected at an area of the surface of a semiconductor layer portion provided on a substrate surface, the location of said area being defined relative to a reference marker, said method including (a) providing said reference marker on part of said substrate surface, (b) depositing semiconductor material on said substrate surface and on said marker to form a layer comprising one portion which grows epitaxially on a part of said substrate surface not covered by said marker to form a monocrystalline portion of the layer and another portion of which layer grows on the surface of said marker as polycrystalline material, and (c) removing said polycrystalline portion over said marker using an etchant which attacks the polycrystalline material of the layer faster than the monocrystalline material, to re-expose said marker for use with said processing step at the surface of the remaining semiconductor layer portion.

2. A method as claimed in claim 1, in which said processing step is effected with the aid of a patterned electron beam which is generated by a photocathode, and the reference marker comprises a metal-based layer pattern for identification by the electron beam.

3. A method as claimed in claim 1 wherein, during the removal of said polycrystalline portion using said etchant, a protective layer is provided over at least the major part of the surface of said monocrystalline portion to protect said surface part against said etchant.

4. A method as in claim 1, wherein the transverse dimensions of the area of the substrate surface occupied by the marker are at least two orders of magnitude greater than the thickness of the deposited layer of semiconductor material.

5. A method as in claim 1, wherein said substrate is of monocrystalline semiconductor material, and before depositing said semiconductor layer, a processing step is effected at an area of said monocrystalline semiconductor substrate surface, the location of said area being defined relative to said reference marker already provided on said substrate surface.

6. A method as claimed in claim 5, in which said processing step effected at an area of said substrate surface involves the provision of an impurity-doped zone which forms in the semiconductor device a buried layer adjacent the interface of the substrate and the deposited semiconductor layer.

7. A method as in claim 1, wherein said marker comprises an oxidized-metal layer pattern enveloped between first and second protective layers, the first protective layers on the layer pattern serving to protect said layer pattern during the processing steps, the second protective layer being present between the oxidized-metal layer pattern and said substrate for protecting the substrate against contamination from said layer pattern.

* * * * *